United States Patent
Chang

(10) Patent No.: US 8,093,718 B2
(45) Date of Patent: Jan. 10, 2012

(54) CHIP STRUCTURE AND STACKED STRUCTURE OF CHIPS

(75) Inventor: Tao-Chih Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 537 days.

(21) Appl. No.: 12/110,335

(22) Filed: Apr. 27, 2008

(65) Prior Publication Data

US 2009/0121348 A1   May 14, 2009

(30) Foreign Application Priority Data

Nov. 8, 2007  (TW) ................................ 96142188 A

(51) Int. Cl.
  *H01L 23/24*  (2006.01)
  *H01L 23/48*  (2006.01)

(52) U.S. Cl. ........ 257/723; 257/686; 257/698; 257/700; 257/737; 257/777; 257/E21.597; 257/E21.705; 257/E23.011; 257/E25.013; 257/E25.023; 174/255; 174/262

(58) Field of Classification Search .................. 257/686, 257/698, 700, 723, 737, 777, E21.597, E21.705, 257/E23.011, E25.013, E25.023; 174/255, 174/262

See application file for complete search history.

(56) References Cited

U.S. PATENT DOCUMENTS

| | | | |
|---|---|---|---|
| 5,378,160 A | 1/1995 | Yumibe et al. | |
| 5,657,537 A | 8/1997 | Saia et al. | |
| 5,673,478 A | 10/1997 | Beene et al. | |
| 5,688,721 A | 11/1997 | Johnson | |
| 5,900,738 A | 5/1999 | Khandros et al. | |
| 6,020,629 A * | 2/2000 | Farnworth et al. | 257/686 |
| 6,034,438 A | 3/2000 | Petersen | |
| 6,038,130 A | 3/2000 | Boeck et al. | |
| 6,350,365 B1 * | 2/2002 | Koyama et al. | 205/125 |
| 6,355,501 B1 | 3/2002 | Fung et al. | |
| 6,537,854 B1 | 3/2003 | Chang et al. | |
| 6,608,371 B2 * | 8/2003 | Kurashima et al. | 257/686 |
| 6,767,818 B1 | 7/2004 | Chang et al. | |

(Continued)

FOREIGN PATENT DOCUMENTS

TW      529805      4/2003

OTHER PUBLICATIONS

"Office Action of Taiwan counterpart application", issued on Sep. 23, 2011, p. 1-p. 9., in which the listed references were cited.

*Primary Examiner* — Dao H Nguyen
(74) *Attorney, Agent, or Firm* — Jianq Chyun IP Office

(57) ABSTRACT

A chip structure and a stacked structure composed of the chip structures are provided. The chip structure has a substrate and at least one compliant contact. Furthermore, the chip structure may further have a redistribution layer for redistributing pads originally disposed around the substrate in a specific arrangement. The substrate has a first surface and a second surface. The compliant contact is embedded into the substrate and protrudes outside the first surface and the second surface of the substrate. The compliant contact has a compliant bump and a conductive layer encapsulating the compliant bump. The conductive layer can be connected with the redistribution layer. Two chip structures can be connected with each other through their compliant contacts or through their compliant contacts or redistribution layers.

15 Claims, 11 Drawing Sheets

U.S. PATENT DOCUMENTS

| | | | |
|---|---|---|---|
| 6,849,805 B2 * | 2/2005 | Honda et al. | 174/250 |
| 6,972,372 B1 | 12/2005 | Tsai et al. | |
| 6,972,490 B2 | 12/2005 | Chang et al. | |
| 7,053,475 B2 * | 5/2006 | Akagawa | 257/686 |
| 7,071,423 B2 * | 7/2006 | Fuller et al. | 174/262 |
| 7,183,648 B2 | 2/2007 | Ramanathan et al. | |
| 2006/0108219 A1 * | 5/2006 | Kuroda et al. | 204/403.1 |
| 2006/0131740 A1 * | 6/2006 | Kawabata et al. | 257/723 |

* cited by examiner

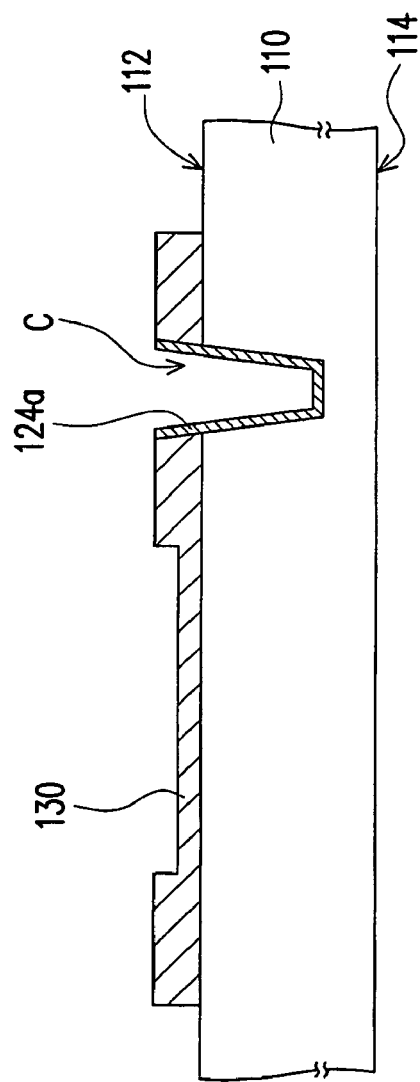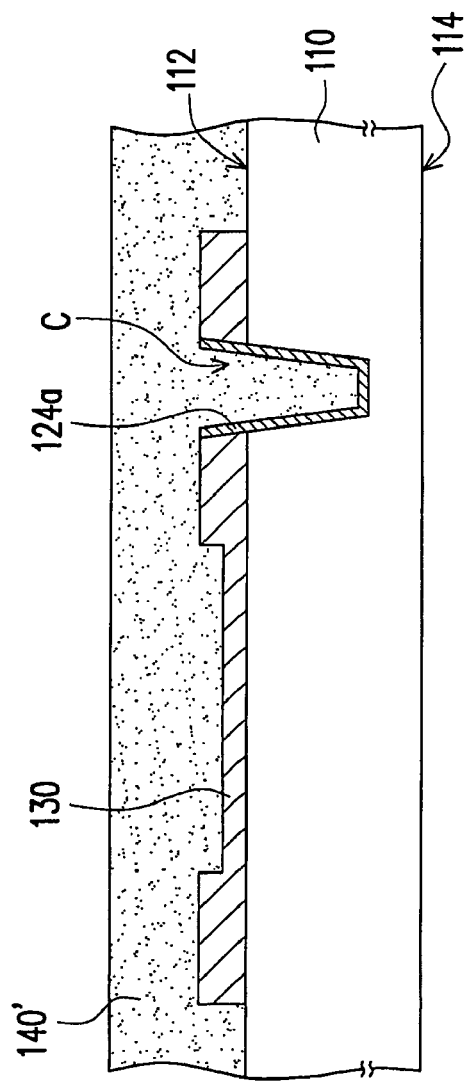

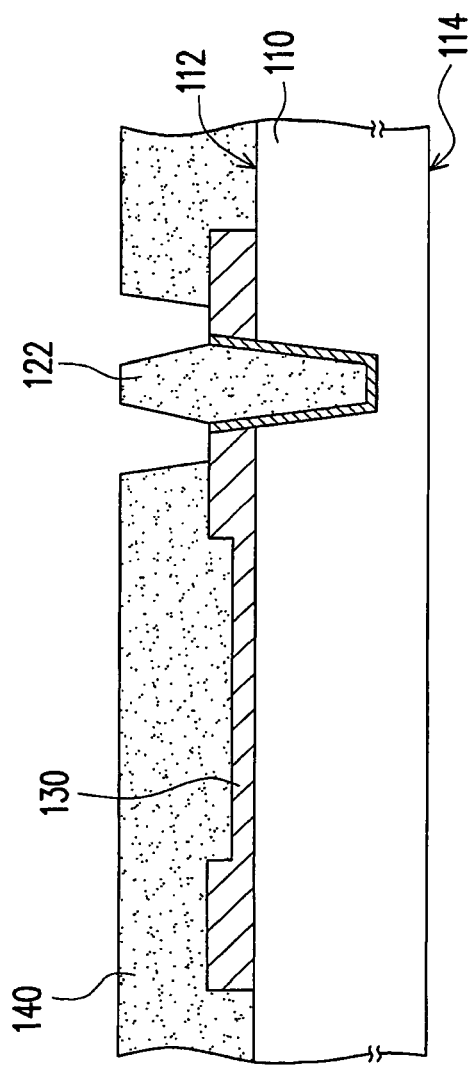
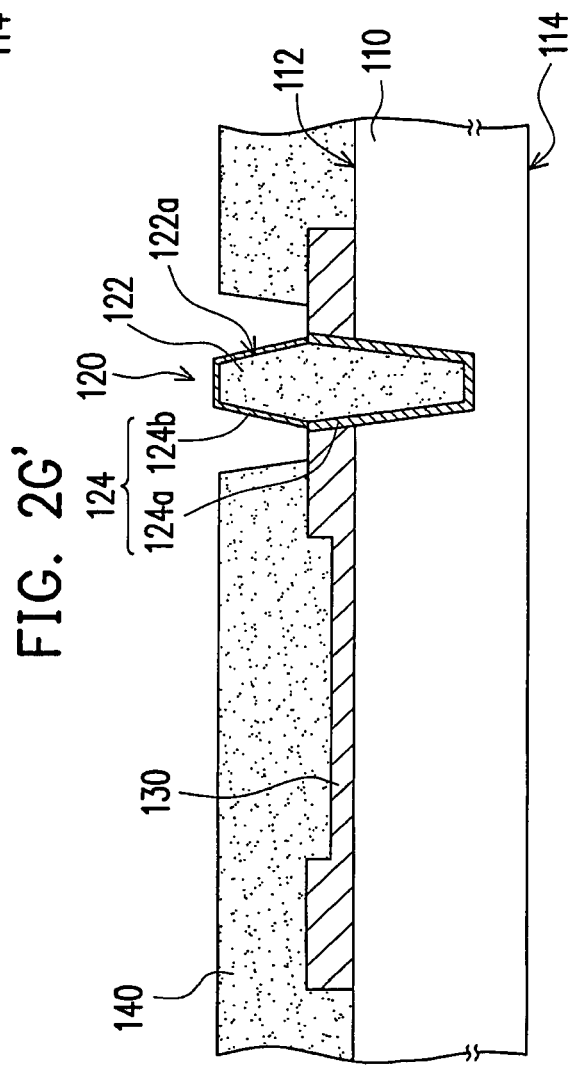
FIG. 2G'
FIG. 2H'

CHIP STRUCTURE AND STACKED STRUCTURE OF CHIPS

CROSS-REFERENCE TO RELATED APPLICATION

This application claims the priority benefit of Taiwan application serial no. 96142188, filed on Nov. 8, 2007. The entirety of the above-mentioned patent application is hereby incorporated by reference herein and made a part of specification.

BACKGROUND OF THE INVENTION

1. Field of the Invention

The present invention relates to a chip structure and a process thereof, and a stacked structure of chips and a process thereof, and particularly to a chip structure having a compliant contact and a process thereof, and a stacked structure of chips and a process thereof.

2. Description of Related Art

In today's information society, users all seek after electronic products with high speed, high quality and multiple functions. In terms of the product exterior appearance, electronic product designs reveal a trend of light weight, thinness and compactness. In order to meet the aforementioned demands, a multi-chip package module has been developed recently. A plurality of chips having different functions or an identical function is packaged altogether on a carrier. The carrier is a substrate or a leadframe and the chips packaged altogether on the carrier are electrically connected with an exterior circuit through the carrier. Therefore, the multi-chip package module has a faster transmission speed, a shorter transmission path and better electric characteristics, and a size and an area of the multi-chip package structure is further reduced. As a result, the multi-chip package technology has been extensively applied in all kinds of electronic products and become the mainstream of future market.

Moreover, m a stacked package structure, the multi-chip package technology is adopted to dispose a plurality of chips or a plurality of passive devices by stacking them on the same carrier. In the prior art, a method of stacking the chips mainly includes manufacturing a micro through hole on the same location in each of the chips, and then filling in a conductive material in the micro through holes by an electroplating process with a high ratio of depth to width. Next, the chips are stacked to connect the micro through holes on the chips so that the chips are electrically turned on among themselves.

Further, another method of stacking includes attaching a substrate having a plurality of electrodes adjacent to multiple layers of stacked chips. The electrodes are electrically turned on among themselves and each of the chips is electrically connected to one of the electrodes respectively so as to achieve electrical turning-on among the chips. Additionally, a method of stacking may further include connecting lines to a side surface and a back surface of the chip, and manufacturing a bump on the back surface of the chip to electrically connect adjacent chips. Still another method of stacking includes connecting lines to a side surface of the chip and completing connection among the lines on the side surface of the stacked chip and electric connection among the chips.

SUMMARY OF THE INVENTION

The present invention relates to a chip structure and a process thereof. The said process is simpler, in which stacking is performed to form a stacked structure of chips having high reliability.

The present invention further relates to a stacked structure of chips composed of the said chip structures and a process and applications thereof.

In order to specifically describe the present invention, a chip structure having a substrate and at least one compliant contact is provided. The substrate has a first surface and a second surface. The compliant contact is embedded into the substrate and protrudes outside the first surface and the second surface of the substrate. The compliant contact has a compliant bump and a conductive layer encapsulating the compliant bump.

In order to specifically describe the present invention, a stacked structure of chips having a plurality of chip units stacking on each other is provided. Each of the chip units has a substrate and at least one compliant contact. The substrate has a first surface and a second surface. The compliant contact is embedded into the substrate and protrudes outside the first surface and the second surface of the substrate. The compliant contact has a compliant bump and a conductive layer encapsulating the compliant bump. Two adjacent chip units are connected with each other through their respective compliant contacts.

In order to specifically describe the present invention, a stacked structure of chips having a plurality of chip units stacking on each other is provided. Each of the chip units has a substrate, a redistribution layer and at least one compliant contact. The substrate has a first surface and a second surface. The compliant contact is embedded into the substrate and protrudes outside the first surface and the second surface of the substrate. The compliant contact has a compliant bump and a conductive layer encapsulating the compliant bump. The redistribution layer is disposed on the first surface of the substrate and connected to the conductive layer of the compliant contact. Two adjacent chip units are connected with each other through their compliant contacts or their redistribution layers.

In order to specifically describe the present invention, a process of a chip is provided. First, a substrate is provided. The substrate has a first surface and a second surface. Afterwards, at least one compliant contact is formed. The compliant contact is embedded into the substrate and protrudes outside the first surface and the second surface of the substrate. The compliant contact includes a compliant bump and a first conductive layer encapsulating the compliant bump.

In order to specifically describe the present invention, a process of a stacked structure of chips is provided. First, a plurality of chip units is formed. Each of the chip units is manufactured by a process as described below. First, a substrate is provided. The substrate has a first surface and a second surface. Then, at least one compliant contact is formed and the compliant contact is embedded into the substrate and protrudes outside the first surface and the second surface of the substrate. The compliant contact includes a compliant bump and a first conductive layer encapsulating the compliant bump. Up to this moment, the chip unit is initially completed. Thereafter, the chip units are stacked to connect every two adjacent chip units with each other through their compliant contacts so that a stacked structure of chips is formed.

In order to specifically describe the present invention, a process of a stacked structure of chips is provided. First, a plurality of chip units is formed. Each of the chip units is manufactured by a process as described below. First, a substrate is provided. The substrate has a first surface and a second surface. Next, a redistribution layer is formed on the first surface of the substrate. Then, at least one compliant contact is formed and the compliant contact is embedded into the substrate and protrudes outside the first surface and the second surface of the substrate. The compliant contact includes a compliant bump and a first conductive layer encapsulating the compliant bump. The first conductive layer is connected with the redistribution layer. Up to this moment, the chip unit is initially completed. Thereafter, the chip units are stacked to connect every two adjacent chip units with each other through their compliant contacts or their redistribution layers so that a stacked structure of chips is formed.

In summary, since the compliant contact of the chip structure in the present invention has flexibility, stress generated by the stacked structure of chips on the compliant contact can be buffered such that reliability of every two adjacent chips mutually connected in the stacked structure of chips is enhanced. From another aspect, in manufacturing the chip structure of the present invention, the process does not require forming conventional micro through holes, and therefore an electroplating process having a high ratio of depth to width is not necessary. Consequently, the process is simplified and manufacturing costs are lowered.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2J and FIGS. 2G' through 2J' illustrate a process of a chip structure according to an embodiment of the present invention.

DESCRIPTION OF EMBODIMENTS

Figure 1:
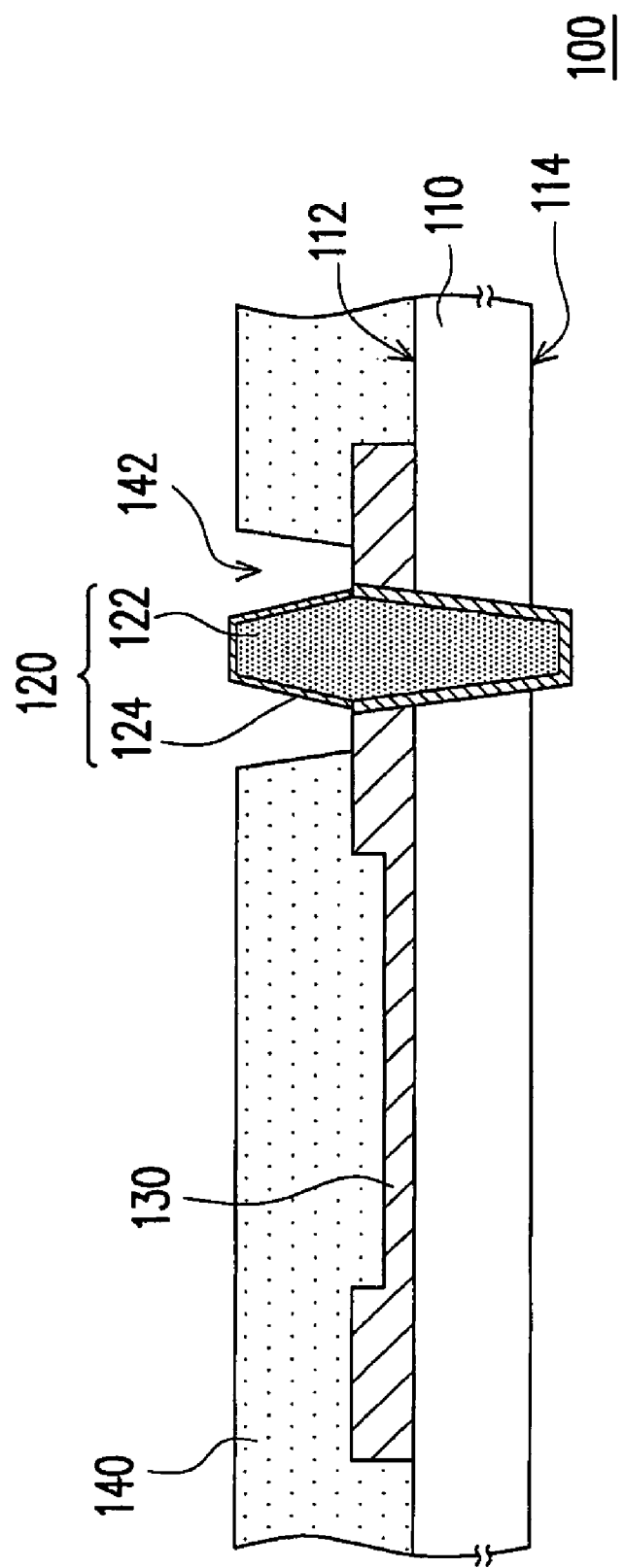
FIG. 1 is a schematic cross-sectional view of a chip structure according to an embodiment of the present invention.

FIG. 1 is a schematic cross-sectional view of a chip structure according to an embodiment of the present invention.

Referring to FIG. 1, a chip structure 100 has a substrate 110 and at least one compliant contact 120. The substrate 110 has a surface 112 and a surface 114. The compliant contact 120 is embedded into the substrate 110 and protrudes outside the surface 112 and the surface 114 of the substrate 110. The substrate 110 is, for example, an integrated circuit (IC) chip. The compliant contact 120 has a compliant bump 122 and a conductive layer 124 encapsulating the compliant bump 122. A material of the compliant bump 122 is a polymer material, for example, and the material of the compliant bump 122 may be polyimide (PI), polydimethylsioxane (PDMS) or an ajinomoto build-up film (ABF). A material of the conductive layer 214 is copper, tin, palladium or titanium, for example.

According to the present embodiment, in order for a plurality of pads (not illustrated) originally disposed around the substrate 110 to be laid out in a certain arrangement, such as redistributed in an area array on the substrate 110, the chip structure 100 may also include a redistribution layer 130. The redistribution layer 130 is disposed on the surface 112 of the substrate 110 and connected to the conductive layer 124 of the compliant contact 120. Moreover, a plurality of chip structures 100 may be stacked to form a stacked structure of chips (not illustrated). In the stacked structure of chips, every two adjacent chip structures 100 may be connected with each other through the compliant contacts 120 or redistribution layers 130 therein. Additionally, according to the present embodiment, to protect and insulate the redistribution layer 130, the chip structure 100 may also have a dielectric layer 140. The dielectric layer 140 is disposed on the surface 112 of the substrate 110 and covers the redistribution layer 130. The dielectric layer 140 has an opening 142 for exposing the compliant contact 120. A material of the dielectric layer 140 is a polymer material, for example, and the material may be PI, PDMS or an ABF. Furthermore, to facilitate the process, the dielectric layer 140 and the compliant bump 122 are manufactured by using an identical material and are composed of the same material.

In actual application, the chip structure of the present invention may also serve as a biochip. Materials of the conductive layer, the dielectric layer and the compliant bump are biocompatible materials respectively. The material of the conductive layer is, for example, metal, oxide or colloid containing metal, and may have different functions according to fields of application. For example, when the chip structure serves as a biochip for biomedical purposes, the material of the conductive layer may be an electro-thermal material such as paramagnetic nano ferrite. When the chip structure serves as a biochip for detection purposes, the material of the conductive layer may be nano colloidal gold. Further, the chip structure of the present invention may still have a sensing medicine disposed on a surface of the conductive layer exposed by the dielectric layer so that the sensing medicine reacts with a substance to be detected in the environment. The aforementioned is further exemplified by a process of the chip structure 100 in the following.

FIGS. 2A through 2J and FIGS. 2G' through 2J' illustrate a process according to an embodiment of a chip structure of the present invention.

Figure 2A:
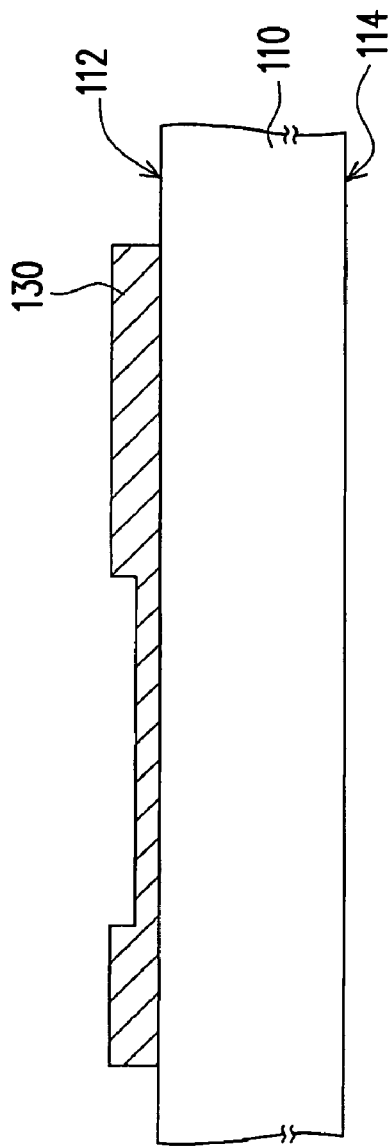

First, referring to FIG. 2A, a substrate 110 is provided. According to the present embodiment, in order for a plurality of pads (not illustrated) originally disposed around the substrate 110 to be laid out in a certain arrangement, such as redistributed in an area array on the substrate 110, a redistribution layer 130 may also be provided. The substrate 110 has a surface 112 and a surface 114, and the redistribution layer 130 can be disposed on the surface 112 of the substrate 110.

Figure 2B:
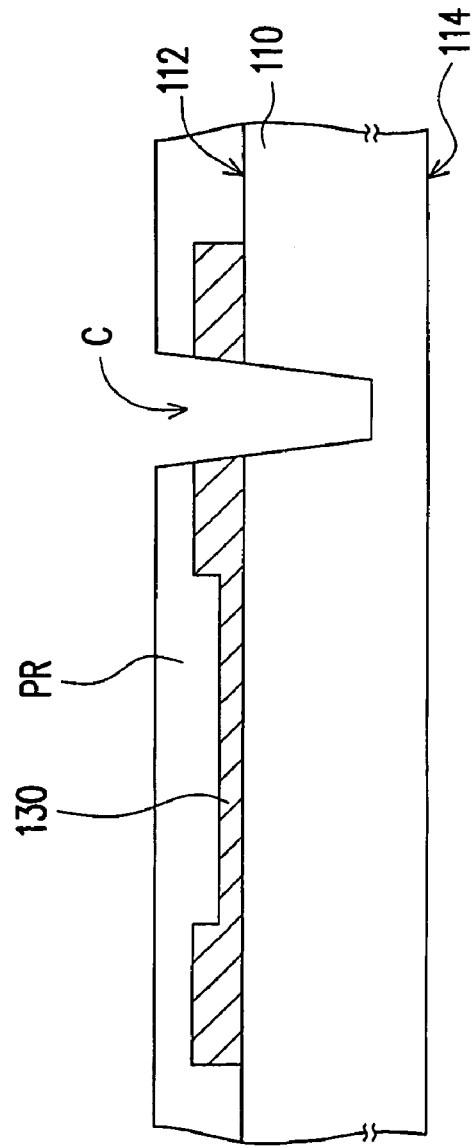

Then, referring to FIG. 2B, a photoresist layer PR is formed on the surface 112 of the substrate 110 to cover the substrate 110. Thereafter, a micro blind hole C penetrating the photoresist layer PR is formed on the substrate 110. In addition, the micro blind hole C may also penetrate both the photoresist layer PR and the redistribution layer 130 simultaneously. A method of forming the photoresist layer PR is, for example, attaching a dry film or coating liquid photoresist. Moreover, a method of forming the micro blind hole C is, for example, by laser drilling or mechanical drilling.

Figure 2C:
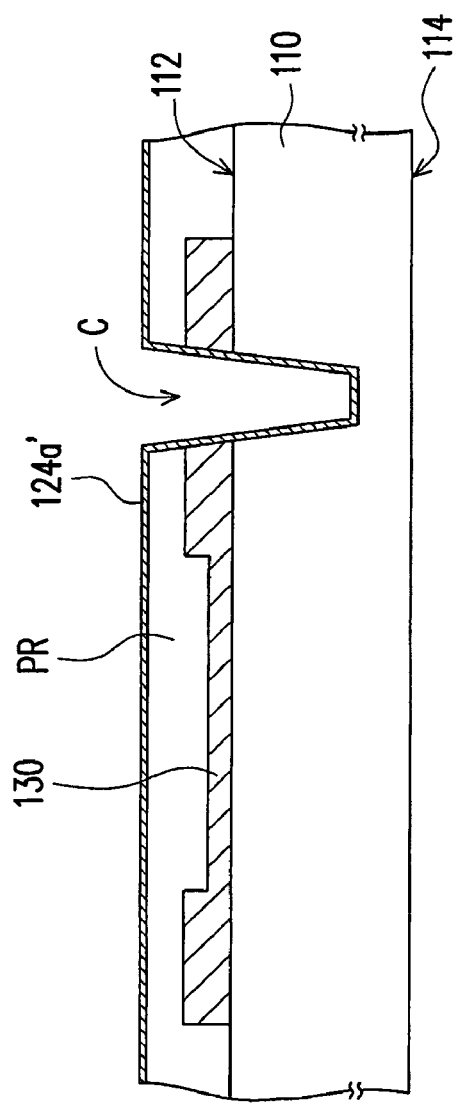
Figure 2D:
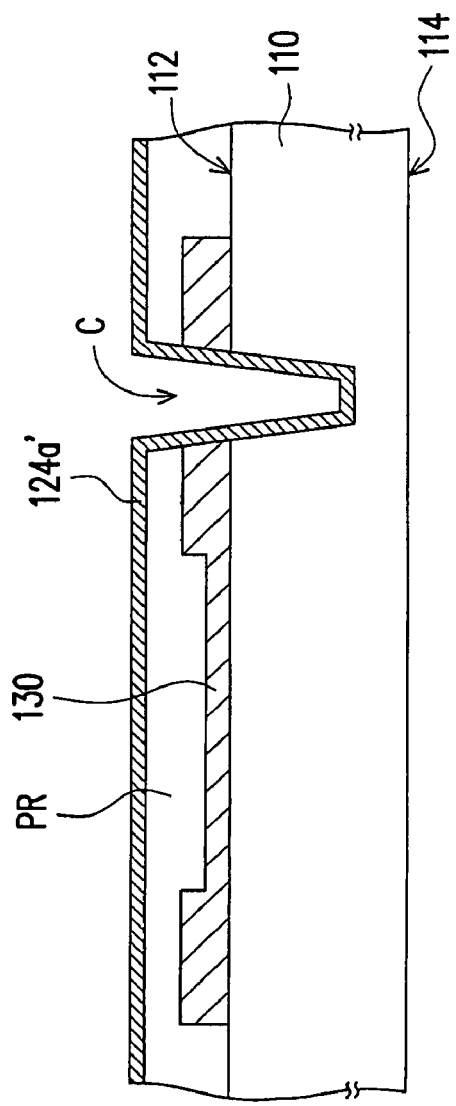

Next, referring to FIG. 2C, a conductive layer 124a' is formed on a surface of the photoresist layer PR and an inner surface of the micro blind hole C by a sputtering process, for example. Additionally, the conductive layer 124a' may be further electrically connected with the redistribution layer 130. Thereafter, referring to FIG. 2D, the conductive layer 124a' is thickened by an electroplating process. As illustrated in FIG. 2E, the photoresist layer PR is removed to form a conductive layer 124a by a photoresist-stripping process. At the moment, the conductive layer 124a' on the photoresist layer PR is removed along with the photoresist layer PR and the conductive layer 124a remains. This process is the so-called lift-off process. Certainly, the present invention is not limited to the said process. Other suitable methods may still be adopted to form the conductive layer 124a.

Figure 2G:
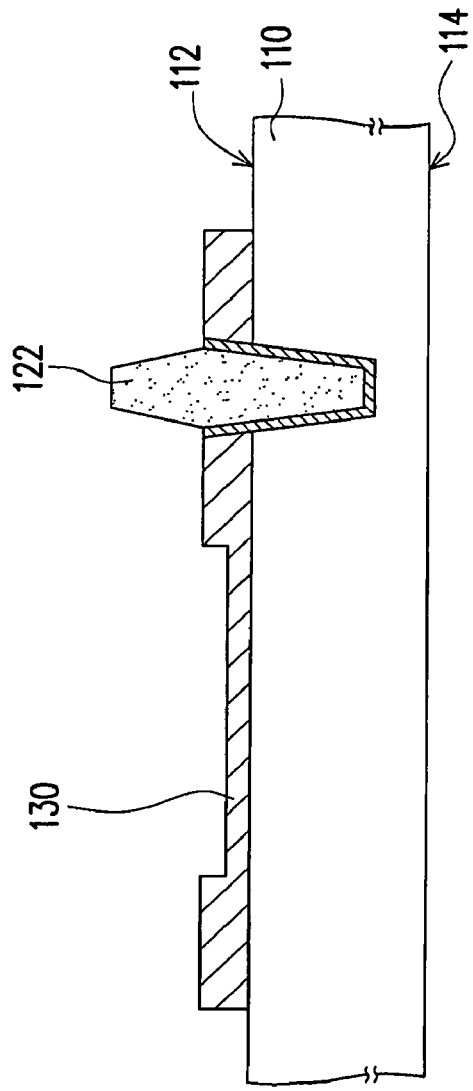

Afterwards, referring to FIG. 2F, a dielectric layer 140' is formed on the surface 112 of the substrate 110 to cover the micro blind hole C. A method of forming the dielectric layer 140' is providing a dielectric material on the substrate 110 by compressing or spin coating. Then, referring to FIG. 2G, the dielectric layer 140' is patterned to form a compliant bump 122. Referring to FIG. 2G', in order to protect and insulate the redistribution layer 130, the dielectric layer 140' is patterned to form not only the compliant bump 122 but a dielectric layer 140 for covering the redistribution layer 130. The dielectric layer 140 and the compliant bump 122 are separate. If a material of the dielectric layer 140' is photosensitive, the dielectric layer 140' can be patterned by steps such as exposure and development. Naturally, in other embodiments of the present invention, the dielectric layer 140' may also be patterned by laser drilling or other suitable processing methods.

Figure 2H:
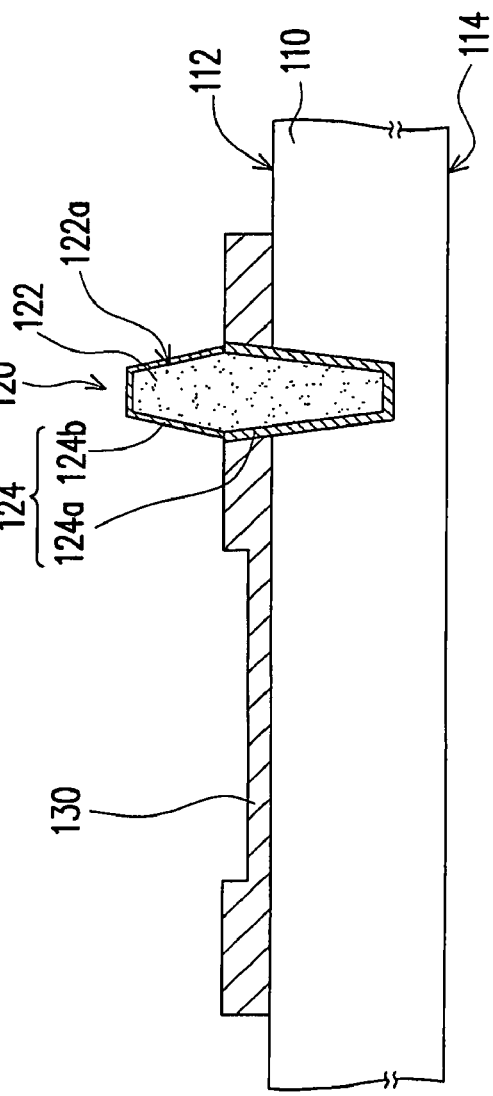
Figure 2I:
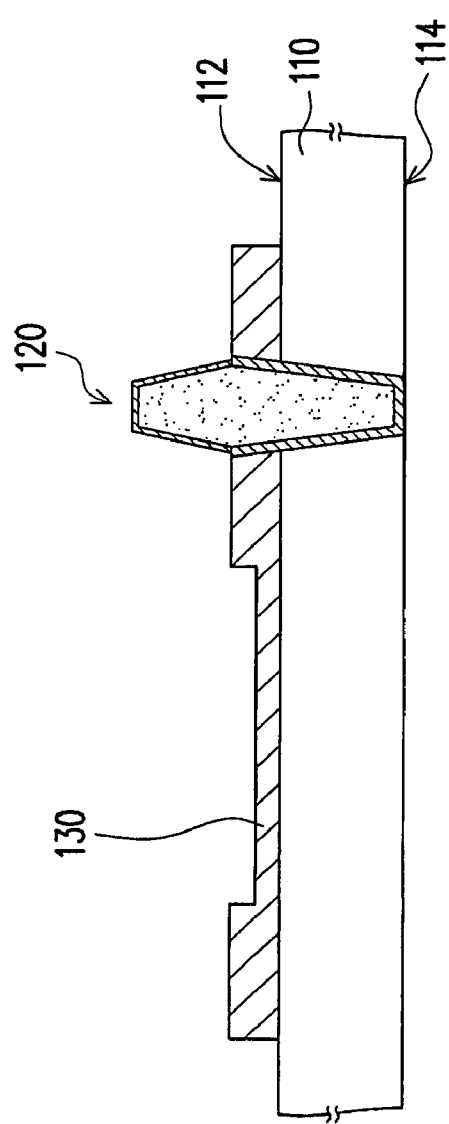
Figure 2J:
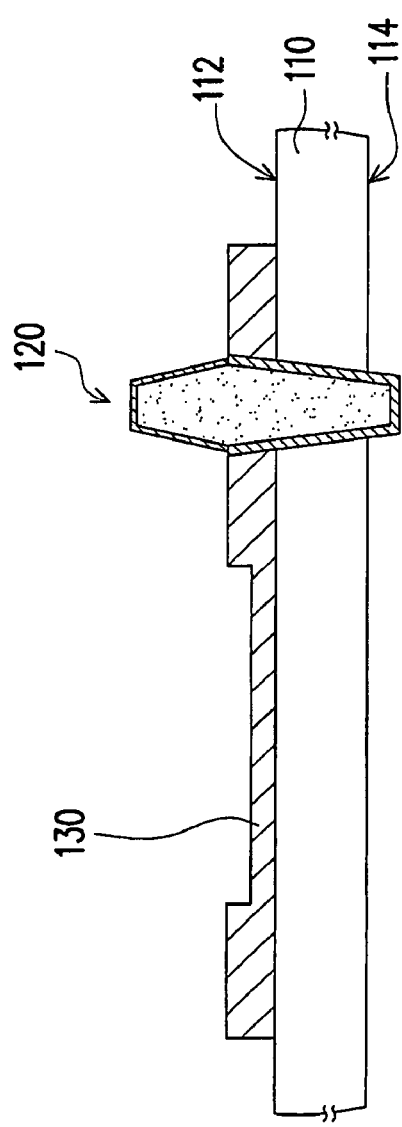
Figure 2I:
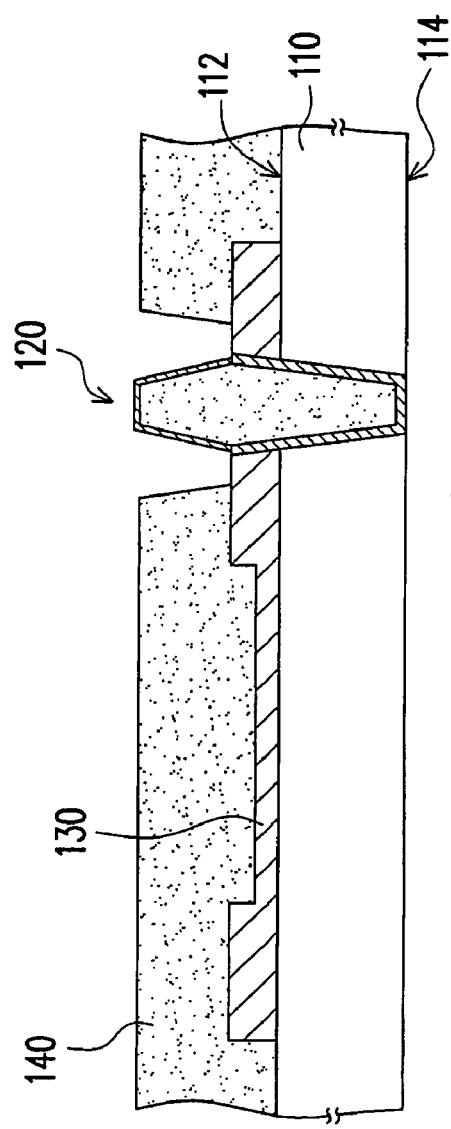
Figure 2J:
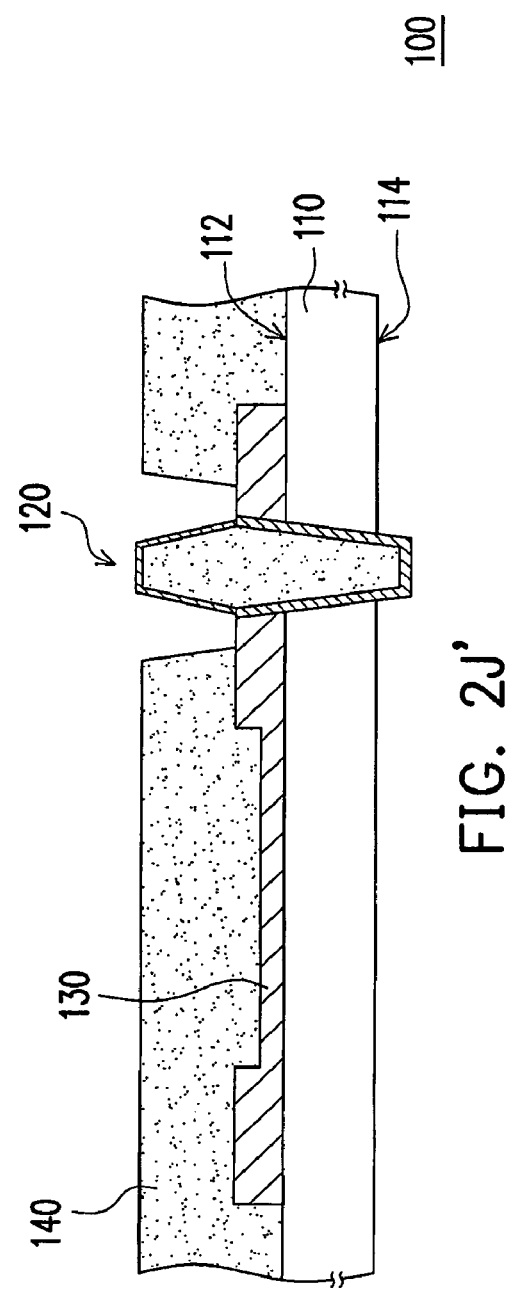

It should be noted that following steps are applicable to FIGS. 2H through 2J and FIGS. 2H' through 2J'. Referring to FIGS. 2H and 2H', a conductive layer 124b is formed on a surface 122a of the compliant bump 122 protruding outside the redistribution layer 130 and the substrate 110. As a result, the conductive layer 124b and the conductive layer 124a are connected with each other to form the conductive layer 124 encapsulating the compliant bump 122. Hence, the compliant bump 122 and the conductive layer 124 encapsulating the compliant bump 122 constitute the compliant contact 120. The conductive layer 124b may adopt a current process technology to manufacture. For example, a mask (such as a patterned photoresist layer) may be first formed on the substrate 110. Then, the conductive layer 124b is formed on a certain region of the substrate 110 by performing a sputtering process or other film-forming technologies with the mask.

Next, referring to FIGS. 2I and 2I', the substrate 110 is thinned so that the surface 114 of the substrate 110 exposes the compliant contact 120. A method of thinning the substrate 110 is, for example, polishing the substrate 110. A more common polishing technology is a chemical mechanical polishing (CMP) process. The CMP process mainly uses a polishing pad along with a chemical reagent to perform both a chemical reaction and a mechanical polishing so as to polish the substrate 110.

Thereafter, referring to FIGS. 2J and 2J', a portion of the substrate 110 is further removed to render the compliant contact 120 protruding outside the surface 114 of the substrate 110. A method of partially removing the substrate 110 is, for example, a reactive ion etching (RIE) process or other suitable technologies.

Manufacturing of the chip structure 100 and the chip structure 200 is substantially completed as described above. In the chip structures 100 and 200 of the present invention, the compliant contacts 120 are manufactured with the micro blind holes C in lieu of the conventional micro through holes. Therefore, no electroplating process with a high ratio of depth to width is required and the process is thus simplified and the manufacturing costs are lowered as well.

The chip structures provided by the present invention may be further stacked on each other to form a stacked structure. A plurality of stacked structures of chips and applications thereof in the present invention are enumerated in the following to facilitate explanation.

Figure 3:
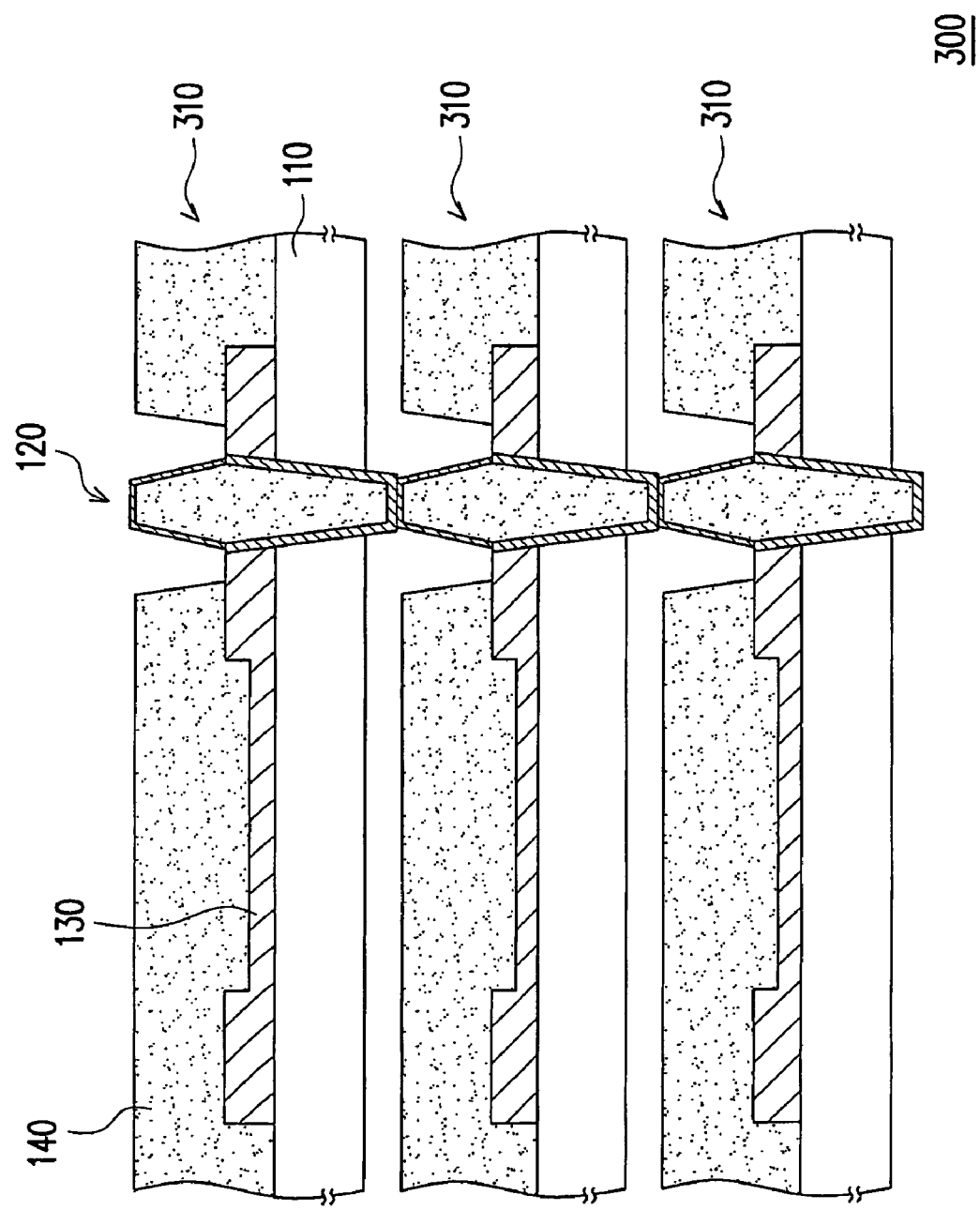
FIG. 3 is a schematic cross-sectional view of a stacked structure of chips according to an embodiment of the present invention.
Figure 4:
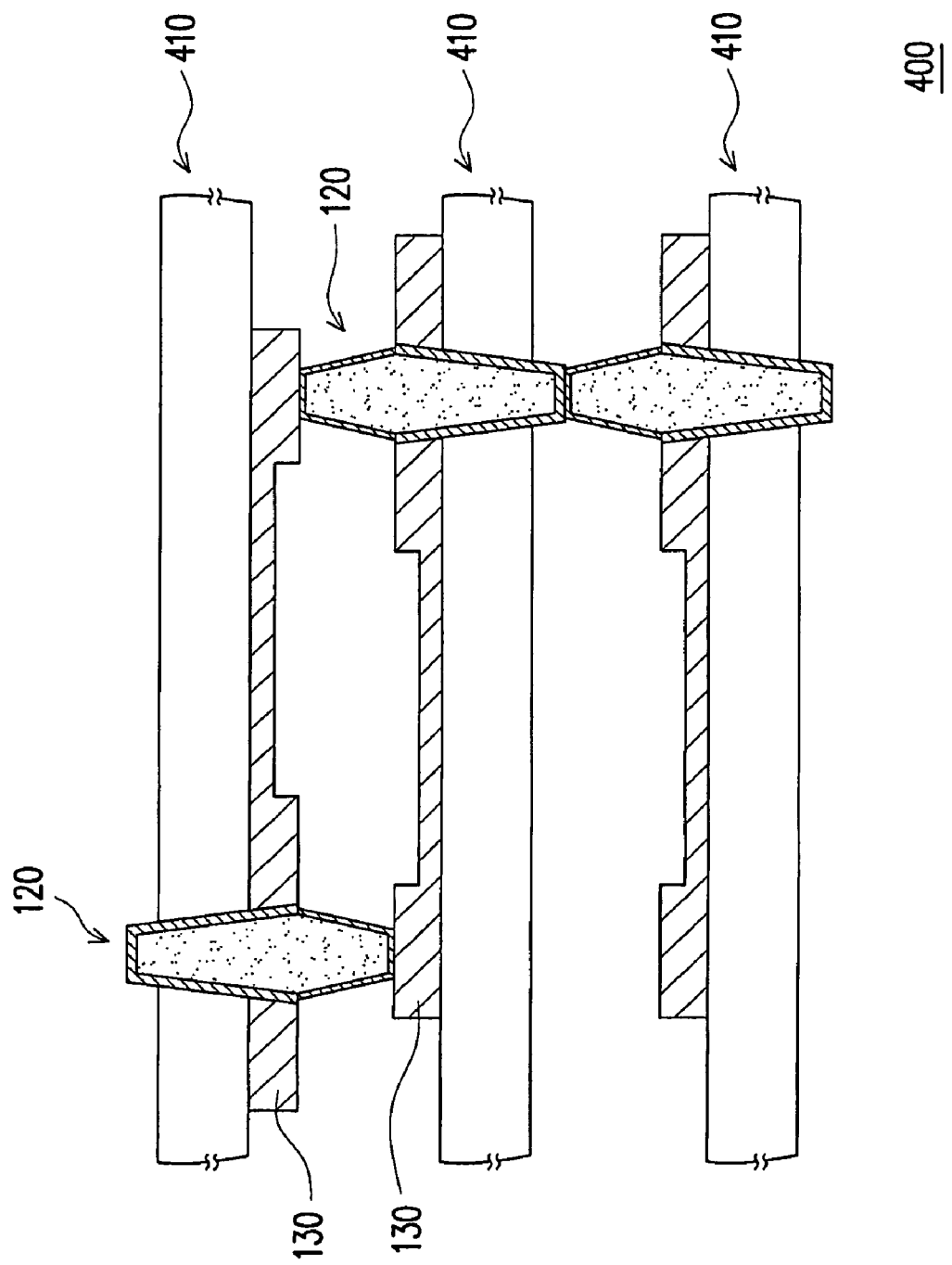
FIG. 4 is a schematic cross-sectional view of another stacked structure of chips according to an embodiment of the present invention.

FIG. 3 is a schematic cross-sectional view of a stacked structure of chips in the present invention. FIG. 4 is a schematic cross-sectional view of another stacked structure of chips in the present invention.

Referring to FIG. 3, a stacked structure of chips 300 includes a plurality of chip units 310 stacked on each other (i.e., the chip structure 100). Two adjacent chip units 310 are connected with each other through their compliant contacts 120. A method of connecting the compliant contacts 120 may be aligning and putting in contact the compliant contacts 120 of the two adjacent chip units 310 first. Afterwards, the compliant contacts 120 are heated, for example, by a laser, microwave or ultrasonic wave heating process. The compliant contacts 120 are slightly melted and mutually connected so as to couple the two adjacent chip units 310. It is noted that a number of the chip units 310 of the stacked structure of chips 300 may be adjusted according to actual situations. To facilitate explanation, the present embodiment is exemplified by the stacked structure of chips made by stacking three chip units 310. Additionally, referring to FIG. 4, a stacked structure of chips 400 is similar to the stacked structure of chips 300. The difference between the two stacked structures 300 and 400 of chips lies in that the stacked structure of chips 400 has a plurality of chip units 410 stacked on each other (i.e., the chip structure 200). Two adjacent chip units 410 may be connected with each other through their compliant contacts 120 or their redistribution layers 130.

Every two adjacent chip units 310 of the stacked structure of chips 300 are connected with each other through their compliant contacts 120. Every two adjacent chip units 410 of the stacked structure of chips 400 are connected with each other through their compliant contacts 120 or their redistribution layers 130. Since the compliant contacts 120 have flexibility, they can buffer stress generated by the stacked structures of chips 300 and 400 on the compliant contacts 120, such as a thermal stress generated by different coefficients of thermo expansion between the chips or between the chip and the contact. Hence, reliability of every two adjacent chip units mutually connected with each other in the stacked structures of chips 300 and 400 is enhanced.

Furthermore, the stacked structure of chips disclosed by the present invention may have other applications, such as biomedical or biosensing purposes. A further description of those applications is provided as follows. It should be noted that the following explanation is exemplified by a stacked structure of chips similar to the stacked structure of chips 300. Certainly, a stacked structure of chips similar to the stacked structure of chips 400 may also be applied for biomedical, biosensing purposes and so forth in other embodiments.

Figure 5:
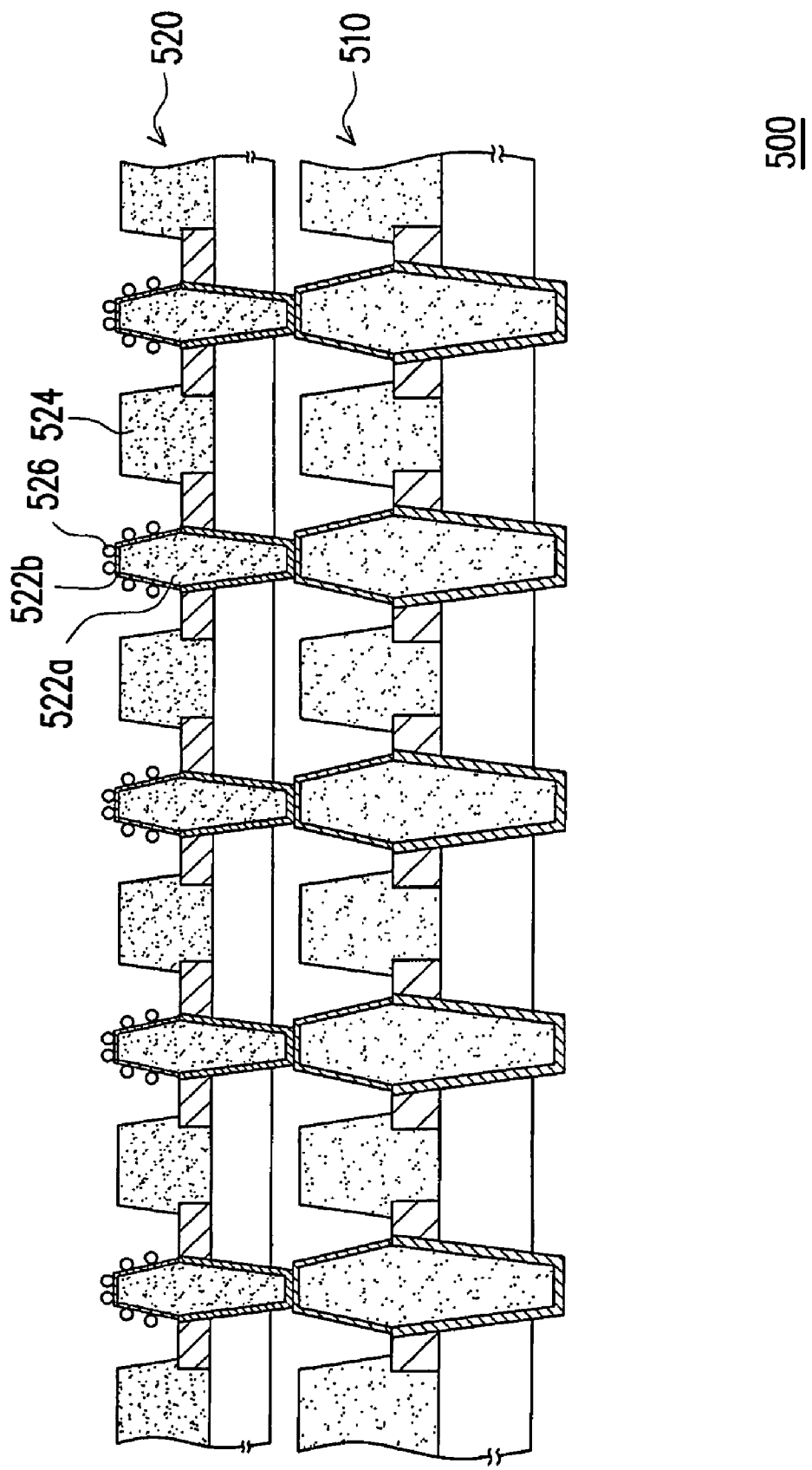
FIG. 5 is a schematic cross-sectional view of still another stacked structure of chips according to an embodiment of the present invention.

FIG. 5 is a schematic cross-sectional view of still another stacked structure of chips according to an embodiment of the present invention.

Referring to FIG. 5, a stacked structure of chips 500 is composed of a chip unit 510 and a chip unit 520 coupled with each other. The chip unit 520 is, for example, a biosensor chip or a biomedical chip as described in the previous embodiment. The chip unit 510 is, for example, a wireless transmission chip, used for transmitting driving signals to the chip unit 520 or receiving detecting signals from the chip unit 520. In addition, to coordinate with biomedical or biosensing applications, a biocompatible material may be selected to manufacture each component in the chip unit 510 and the chip unit 520 under preferable circumstances. A compliant bump 522a, a conductive layer 522b and a dielectric layer 524 of the chip unit 520 may be manufactured respectively by using biocompatible materials, for example. A material of the conductive layer 522b is, for example, metal, oxide or colloid containing metal.

If the stacked structure of chips 500 is applied for biosensing purposes, the chip unit 510 may be a wireless transmission chip, while the chip unit 520 may be a biosensor chip, and a material of the conductive layer 522b may be nano colloidal gold. The conductive layer 522b on the compliant bump 522a of the chip unit 520 may have a sensing medicine 526 to detect exterior substances, and a detection signal is transmitted to the chip unit 510 through the chip unit 520. Afterwards, a receptor (not illustrated) receives the detection signal of the chip unit 510 to perform an analysis of the detection signal. The chip unit 510 may also transmit a driving signal to the chip unit 520 to control the chip unit 520.

If the stacked structure of chips 500 is applied in biological therapy, the chip unit 510 may be a wireless transmission chip, while the chip unit 520 may be a biological therapy chip, and a material of the conductive layer 522b may be a electrothermal material such as a paramagnetic nano ferrite. The conductive layer 522b on the compliant bump 522b of the chip unit 520 may have a sensing medicine 526. When the sensing medicine 526 detects a specific substance, such as a malignant cell (not illustrated), a signal is transmitted through the chip unit 520 to the chip unit 510 and then a receptor (not illustrated) receives the signal of the chip unit 510. At the moment, the receptor starts an equipment (not illustrated) capable of generating a magnetic field. Since the conductive layer 522b of the stacked structure of chips 500 is within the magnetic field generated by the equipment capable of generating a magnetic field, the conductive layer 522b is thus affected by the magnetic field and starts giving out heat and thereby killing the malignant cell. The chip unit 510 may also transmit a driving signal to the chip unit 520 to control the chip Unit 520.

In summary, the compliant contact of the chip structure of the present invention has flexibility. Therefore, in the stacked structure of chips of the present invention, when two adjacent chip units are connected with each other through their compliant contacts or through their compliant contacts and their redistribution layers, the stress generated by the stacked structure of chips on the compliant contacts is buffered by the compliant contacts. Hence, the reliability of every two adjacent chip units mutually connected with each other in the stacked structure of chips is enhanced. Moreover, in comparison with the conventional method of forming a micro through hole, when manufacturing the compliant contact of the chip structure in the present invention, only the micro blind hole is required to be formed therein and an electroplating process having a high ratio of depth to width is not necessary. Hence, the process is simplified and the manufacturing costs are lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip structure, comprising:
   a semiconductor substrate, having a first surface and a second surface; and
   at least one compliant contact, comprising a compliant bump embedded into the substrate and protruding outside the first surface and the second surface of the semiconductor substrate and a conductive layer encapsulating the compliant bump, wherein a top portion, a bottom portion, and a side portion of the compliant bump are enclosed by the conductive layer, and a portion of the compliant contact is exposed to an outside circumstance.

2. The chip structure as claimed in claim 1, further comprising a redistribution layer, disposed on the first surface of the substrate and connected with the conductive layer of the compliant contact.

3. The chip structure as claimed in claim 2, further comprising a dielectric layer, disposed on the first surface of the substrate and covering the redistribution layer, the dielectric layer having an opening to expose the compliant contact, and a top surface of the compliant bump being aligned with a top surface of the dielectric layer.

4. The chip structure as claimed in claim 3, further comprising a sensing medicine, disposed on a surface of the conductive layer exposed by the dielectric layer.

5. The chip structure as claimed in claim 3, wherein a material of the dielectric layer comprises a polymer material.

6. The chip structure as claimed in claim 1, wherein a material of the compliant bump comprises a polymer material.

7. The chip structure as claimed in claim 2, further comprising a dielectric layer, disposed on the first surface of the substrate and covering the redistribution layer, the dielectric layer having an opening to expose the compliant contact, and the compliant contact and the dielectric layer are spaced apart.

8. A stacked structure of chips, comprising:
   a first chip unit, comprising:
      a first semiconductor substrate, having a first surface and a second surface;
      at least one first compliant contact, comprising a first compliant bump embedded into the first semiconductor substrate and protruding outside the first surface and the second surface of the first semiconductor substrate and a first conductive layer encapsulating the first compliant bump, wherein a top portion, a bottom portion, and a side portion of the first compliant bump are enclosed by the first conductive layer;
   a second chip unit, comprising:
      a second semiconductor substrate, having a third surface and a fourth surface; and
      at least one second compliant contact, comprising a second compliant bump embedded into the second semiconductor substrate and protruding outside the third surface and the fourth surface of the second semiconductor substrate and a second conductive layer encapsulating the second compliant bump, wherein a top portion, a bottom portion, and a side portion of the second compliant bump are enclosed by the second conductive layer,
   wherein the second chip unit is stacked on the first chip unit through bonding the first compliant contact with the corresponding second compliant contact.

9. The stacked structure of chips as claimed in claim 8, wherein the first chip unit further comprises a redistribution layer disposed on the first surface of the first semiconductor substrate and connected with the first conductive layer of the first compliant contact.

10. The stacked structure of chips as claimed in claim 9, wherein the first chip unit further comprises a dielectric layer disposed on the first surface of the first semiconductor substrate and covering the redistribution layer, the dielectric layer having an opening to expose the first compliant contact, and a top surface of the first compliant bump being aligned with a top surface of the dielectric layer.

11. The stacked structure of chips as claimed in claim 10, wherein a material of the dielectric layers comprises a polymer material.

12. The stacked structure of chips as claimed in claim 9, wherein the first chip unit further comprises a dielectric layer disposed on the first surface of the first semiconductor substrate and covering the redistribution layer, the dielectric layer having an opening to expose the first compliant contact, and the first compliant contact and the dielectric layer are spaced apart.

13. The stacked structure of chips as claimed in claim 8, wherein a material of the first compliant bump or the second compliant bump comprises a polymer material.

14. A stacked structure of chips, comprising:
    a first chip unit, comprising:
        a first semiconductor substrate, having a first surface and a second surface;
        at least one first compliant contact, comprising a first compliant bump embedded into the first semiconductor substrate and protruding outside the first surface and the second surface of the first semiconductor substrate and a first conductive layer encapsulating the first compliant bump, wherein a top portion, a bottom portion, and a side portion of the first compliant bump are enclosed by the first conductive layer; and
        a first redistribution layer, disposed on the first surface of the first semiconductor substrate and connected with the first conductive layer of the first compliant contact;
    a second chip unit, comprising:
        a second semiconductor substrate, having a third surface and a fourth surface;
        at least one second compliant contact, comprising a second compliant bump embedded into the second semiconductor substrate and protruding outside the third surface and the fourth surface of the second semiconductor substrate and a second conductive layer encapsulating the second compliant bump, wherein a top portion, a bottom portion, and a side portion of the second compliant bump are enclosed by the second conductive layer; and
        a second redistribution layer, disposed on the third surface of the second semiconductor substrate and connected with the second conductive layer of the second compliant contact,
    wherein the second chip unit is stacked on the first chip unit with the third surface facing the first surface, the first compliant contact is bonded to the second redistribution layer, and the second compliant contact is bonded to the first redistribution layer.

15. The stacked structure of chips as claimed in claim 14, wherein a material of the first compliant bump or the second compliant bump comprises a polymer material.

* * * * *